US009159747B2

(12) United States Patent
Nakano et al.

(10) Patent No.: US 9,159,747 B2
(45) Date of Patent: Oct. 13, 2015

(54) DISPLAY DEVICE, THIN FILM TRANSISTOR, METHOD FOR MANUFACTURING DISPLAY DEVICE, AND METHOD FOR MANUFACTURING THIN FILM TRANSISTOR

(71) Applicant: Kabushiki Kaisha Toshiba, Minato-ku (JP)

(72) Inventors: Shintaro Nakano, Kanagawa-ken (JP); Tomomasa Ueda, Kanagawa-ken (JP); Kentaro Miura, Kanagawa-ken (JP); Nobuyoshi Saito, Tokyo (JP); Tatsunori Sakano, Kanagawa-ken (JP); Yuya Maeda, Kanagawa-ken (JP); Hajime Yamaguchi, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/175,169

(22) Filed: Feb. 7, 2014

(65) Prior Publication Data

US 2014/0284594 A1 Sep. 25, 2014

(30) Foreign Application Priority Data

Mar. 19, 2013 (JP) ................. 2013-057377

(51) Int. Cl.
*H01L 27/12* (2006.01)
*H01L 29/49* (2006.01)
*H01L 29/786* (2006.01)

(52) U.S. Cl.
CPC .......... *H01L 27/124* (2013.01); *H01L 27/1225* (2013.01); *H01L 27/1237* (2013.01); *H01L27/1248* (2013.01); *H01L 27/1259* (2013.01); *H01L 29/4908* (2013.01); *H01L 29/7869* (2013.01); *H01L 29/78603* (2013.01); *H01L 29/78696* (2013.01)

(58) Field of Classification Search
CPC ............ H01L 27/1225; H01L 27/1237; H01L 27/1248; H01L 29/78603; H01L 29/78696
USPC ..................... 257/43, 60, 101, 103
See application file for complete search history.

(56) References Cited

U.S. PATENT DOCUMENTS

2008/0290393 A1* 11/2008 Kakehata et al. ............. 257/316
2011/0089416 A1    4/2011 Yamazaki et al.
(Continued)

FOREIGN PATENT DOCUMENTS

| KR | 10-2011-0097991 | 8/2011 |
| KR | 10-2012-0065249 | 6/2012 |
| KR | 10-2012-0127250 | 11/2012 |

OTHER PUBLICATIONS

Office Action issued Apr. 1, 2015 in Korean Patent Application No. 10-2014-0023426 (with English translation).

*Primary Examiner* — Matthew E Warren
(74) *Attorney, Agent, or Firm* — Oblon, McClelland, Maier & Neustadt, L.L.P.

(57) ABSTRACT

According to one embodiment, a display device includes a substrate unit, a thin film transistor, a pixel electrode and a display layer. The substrate unit includes a substrate, a first insulating layer provided on the substrate, and a second insulating layer provided on the first insulating layer. The thin film transistor is provided on the substrate unit and includes a gate electrode provided on the second insulating layer, a semiconductor layer of an oxide separated from the gate electrode, a gate insulation layer provided between the gate electrode and the semiconductor layer, a first conductive portion, a second conductive portion, and a third insulating layer. The pixel electrode is connected to one selected from the first and second conductive portions. The display layer is configured to have a light emission or a change of optical characteristic occurring according to a charge supplied to the pixel electrode.

18 Claims, 10 Drawing Sheets

(56) References Cited

U.S. PATENT DOCUMENTS

| | | |
|---|---|---|
| 2011/0253998 A1 | 10/2011 | Theiss et al. |
| 2012/0241737 A1* | 9/2012 | Imoto et al. .................... 257/43 |
| 2013/0048978 A1* | 2/2013 | Watanabe et al. .............. 257/43 |
| 2014/0217396 A1* | 8/2014 | Imamura et al. ............... 257/43 |

* cited by examiner

DISPLAY DEVICE, THIN FILM TRANSISTOR, METHOD FOR MANUFACTURING DISPLAY DEVICE, AND METHOD FOR MANUFACTURING THIN FILM TRANSISTOR

CROSS-REFERENCE TO RELATED APPLICATIONS

This application is based upon and claims the benefit of priority from Japanese Patent Application No. 2013-057377, filed on Mar. 19, 2013; the entire contents of which are incorporated herein by reference.

FIELD

Embodiments described herein relate generally to a display device, a thin film transistor, a method for manufacturing the display device, and a method for manufacturing the thin film transistor.

BACKGROUND

There are thin film transistors that use an amorphous oxide semiconductor. Such an oxide semiconductor can be formed uniformly as a film over a large surface area by, for example, sputtering at room temperature. The oxide semiconductor is transmissive in the visible region. The oxide semiconductor can be formed on a plastic film substrate that has poor heat resistance. Thereby, a flexible and transparent thin film transistor can be obtained. High reliability is desirable for the thin film transistor that uses the oxide semiconductor.

DETAILED DESCRIPTION

Figure 1A:
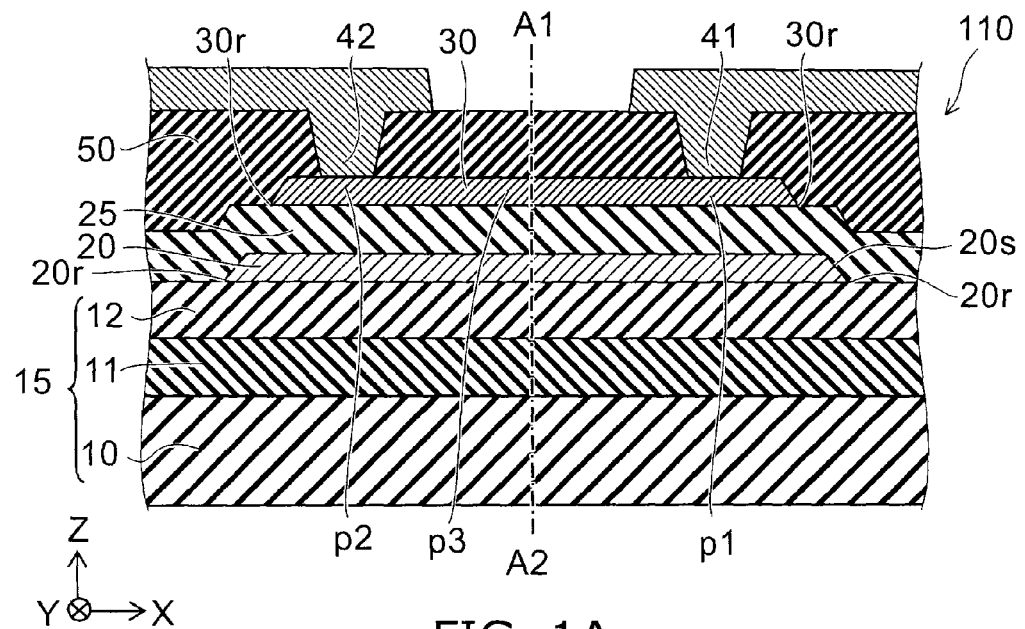
FIG. 1A and FIG. 1B are schematic cross-sectional views showing a thin film transistor according to a first embodiment.

According to one embodiment, a display device includes a substrate unit, a thin film transistor, a pixel electrode and a display layer. The substrate unit includes a substrate, a first insulating layer having a first hydrogen concentration provided on the substrate, and a second insulating layer provided on the first insulating layer, the second insulating layer having a second hydrogen concentration higher than the first hydrogen concentration. The thin film transistor is provided on the substrate unit. The thin film transistor includes a gate electrode provided on the second insulating layer, a semiconductor layer of an oxide including at least one selected from indium, gallium, and zinc separated from the gate electrode in a stacking direction from the substrate toward the second insulating layer, the semiconductor layer having a first portion, a second portion separated from the first portion in a first direction perpendicular to the stacking direction, and a third portion provided between the first portion and the second portion, a gate insulation layer provided between the gate electrode and the semiconductor layer, a first conductive portion electrically connected to one selected from the first portion and the second portion, a second conductive portion electrically connected to other one selected from the first portion and the second portion, and a third insulating layer covering a portion of the semiconductor layer other than the first portion and the second portion. The pixel electrode is connected to one selected from the first conductive portion and the second conductive portion of the thin film transistor. The display layer is configured to have a light emission or a change of at least one optical characteristic selected from absorptivity, reflectivity, scattering properties, refractive properties, and optical rotatory properties occurring according to a charge supplied to the pixel electrode.

According to one embodiment, a thin film transistor includes a substrate, a first insulating layer having a first hydrogen concentration provided on the substrate, a second insulating layer provided on the first insulating layer, the second insulating layer having a second hydrogen concentration higher than the first hydrogen concentration, a gate electrode provided on the second insulating layer, a semiconductor layer of an oxide including at least one selected from indium, gallium, and zinc separated from the gate electrode in a stacking direction from the substrate toward the second insulating layer, the semiconductor layer having a first portion, a second portion separated from the first portion in a first direction perpendicular to the stacking direction, and a third portion provided between the first portion and the second portion, a gate insulation layer provided between the gate electrode and the semiconductor layer, a first conductive portion electrically connected to one selected from the first portion and the second portion, a second conductive portion electrically connected to other one selected from the first portion and the second portion, and a third insulating layer covering a portion of the semiconductor layer other than the first portion and the second portion.

According to one embodiment, a method for manufacturing a display device is disclosed. The method can include forming a first insulating layer having a first hydrogen concentration on a substrate at a first temperature, and forming a second insulating layer having a second hydrogen concentration higher than the first hydrogen concentration on the first insulating layer at a second temperature lower than the first temperature. The method can form a thin film transistor on a substrate unit including the substrate, the first insulating layer and the second insulating layer. The thin film transistor includes a structural body, a first conductive portion, a second conductive portion, and a third insulating layer, the structural body including a gate electrode, a semiconductor layer, and a gate insulation layer provided between the gate electrode and the semiconductor layer, the gate electrode being provided on the second insulating layer, the semiconductor layer being a semiconductor layer of an oxide including at least one selected from indium, gallium, and zinc separated from the gate electrode in a stacking direction from the substrate toward the second insulating layer, the semiconductor layer having a first portion, a second portion separated from the first portion in a first direction perpendicular to the stacking direction, and a third portion provided between the first portion and the second portion, the first conductive portion being electrically connected to one selected from the first portion and the second portion, the second conductive portion being electrically connected to other one selected from the first portion and the second portion, the third insulating layer covering a portion of the semiconductor layer other than the first portion and the second portion. The method can include forming a pixel electrode connected to one selected from the first conductive portion and the second conductive portion of the thin film transistor. In addition the method can include forming a display layer having a light emission or a change of at least one optical characteristic selected from absorptivity, reflectivity, scattering properties, refractive properties, and optical rotatory properties occurring according to a potential of the pixel electrode.

According to one embodiment, a method for manufacturing a thin film transistor is disclosed. The method can include forming a first insulating layer having a first hydrogen concentration on a substrate at a first temperature, and forming a second insulating layer having a second hydrogen concentration higher than the first hydrogen concentration on the first insulating layer at a second temperature lower than the first temperature. The method can form a structural body including a gate electrode, a semiconductor layer, and a gate insulation layer provided between the gate electrode and the semiconductor layer, the gate electrode being provided on the second insulating layer, the semiconductor layer being a semiconductor layer of an oxide including at least one selected from indium, gallium, and zinc separated from the gate electrode in a stacking direction from the substrate toward the second insulating layer, the semiconductor layer having a first portion, a second portion separated from the first portion in a first direction perpendicular to the stacking direction, and a third portion provided between the first portion and the second portion. The method can include forming a third insulating layer to cover a portion of the semiconductor layer other than the first portion and the second portion. In addition, the method can include forming a first conductive portion electrically connected to one selected from the first portion and the second portion and forming a second conductive portion electrically connected to other one selected from the first portion and the second portion.

Various Embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

First Embodiment

The embodiment relates to a thin film transistor.

Figure 1B:
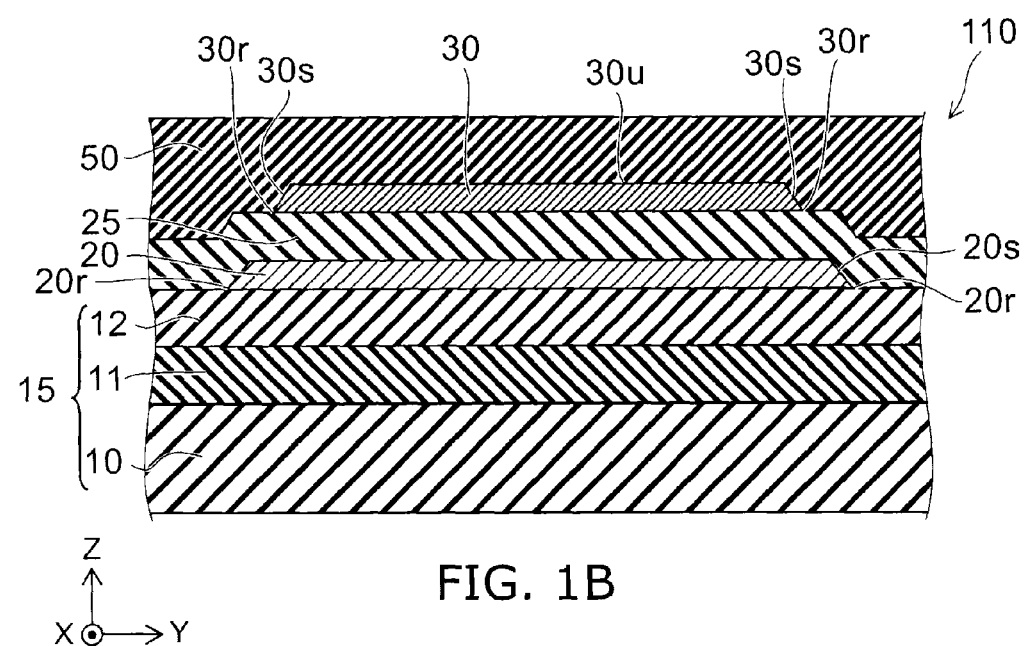

FIG. 1A and FIG. 1B are schematic cross-sectional views showing the thin film transistor according to the first embodiment.

FIG. 1B is a cross-sectional view along line A1-A2 of FIG. 1A.

As shown in FIG. 1A and FIG. 1B, the thin film transistor 110 according to the embodiment includes a substrate unit 15, a gate electrode 20, a semiconductor layer 30, a gate insulation layer 25, a first conductive portion 41, a second conductive portion 42, and a third insulating layer 50.

The substrate unit 15 includes a substrate 10, a first insulating layer 11, and a second insulating layer 12.

The substrate 10 includes, for example, a glass substrate. The substrate 10 may include a resin substrate of polyimide, polyethylene naphthalate, polyethersulphone, etc. The substrate 10 may include a base body and an insulating layer provided on the base body. The insulating layer may be a resin. The base body may be non-transparent. The base body may include, for example, stainless steel. For example, the upper surface of the substrate 10 is insulative.

The thickness of the substrate 10 is, for example, not less than 1 µm (micrometer) and not more than 1000 µm.

The first insulating layer 11 is provided on the substrate 10. The first insulating layer 11 includes, for example, one selected from silicon oxide ($SiO_x$), silicon nitride ($SiN_x$), and silicon oxynitride ($SiO_xN_y$). The first insulating layer 11 may include, for example, a multilayered film including at least two films selected from a silicon oxide ($SiO_x$) film, a silicon nitride ($SiN_x$) film, and a silicon oxynitride ($SiO_xN_y$) film.

The first insulating layer 11 is formed at a high temperature. The film formation temperature (a first temperature) of the first insulating layer 11 is, for example, not less than 300° C. and not more than 400° C. A dense film is obtained by forming at a high temperature. The first insulating layer 11 provides good barrier properties for impurities (including, for example, water) from the substrate 10. The thickness of the first insulating layer 11 is, for example, not less than 10 nm (nanometers) and not more than 1000 nm.

The second insulating layer 12 is provided on the first insulating layer 11. The second insulating layer 12 has a hydrogen concentration (a second hydrogen concentration) that is higher than the hydrogen concentration (a first hydrogen concentration) of the first insulating layer 11. The first hydrogen concentration may be 0. In other words, the first insulating layer 11 may not include hydrogen.

The second insulating layer 12 may include, for example, one selected from silicon oxide ($SiO_x$), silicon nitride ($SiN_x$), and silicon oxynitride ($SiO_xN_y$). The first insulating layer 11 may include, for example, a multilayered film including at least two films selected from a silicon oxide ($SiO_x$) film, a silicon nitride ($SiN_x$) film, and a silicon oxynitride ($SiO_xN_y$) film. The second insulating layer 12 may include, for example, a TEOS film.

The second insulating layer 12 is formed by, for example, PECVD. The film formation temperature (a second temperature) of the second insulating layer 12 is lower than the film formation temperature (a first temperature) of the first insulating layer 11. The film formation temperature of the second insulating layer 12 is not less than 25° C. and not more than 230° C. It is more favorable for the film formation temperature of the second insulating layer 12 to be, for example, not more than 200° C. The hydrogen concentration can be high by performing the film formation at a low temperature.

The thickness of the second insulating layer 12 is, for example, not less than 10 nm and not more than 500 nm.

A direction from the substrate 10 toward the second insulating layer 12 is taken as the stacking direction. The stacking direction is taken as a Z-axis direction. One direction perpendicular to the Z-axis direction is taken as an X-axis direction. A direction perpendicular to the Z-axis direction and the X-axis direction is taken as a Y-axis direction.

In the example, the first insulating layer 11 contacts the substrate 10 and the second insulating layer 12.

The gate electrode 20, the semiconductor layer 30, the gate insulation layer 25, the first conductive portion 41, the second conductive portion 42, and the third insulating layer 50 are provided on the substrate unit 15.

In the specification of the application, the "state of being provided on" includes the state of being provided in direct contact and the state in which another component is provided therebetween.

The gate electrode 20 is provided on the second insulating layer 12. The thickness of the gate electrode 20 is, for example, not less than 10 nm and not more than 500 nm. The gate electrode 20 may include various materials that are conductive. For example, the gate electrode 20 may include a refractory metal such as molybdenum-tungsten (MoW), molybdenum-tantalum (MoTa), or tungsten (W). The gate electrode 20 may include, for example, an Al alloy. The Al alloy may include Al as the main component; and hillock-preventing measures may be performed. The gate electrode 20 may include, for example, AlNd, etc.

The gate electrode 20 has a side surface 20s. The side surface 20s intersects the X-Y plane (a plane perpendicular to the stacking direction). The side surface 20s of the gate electrode 20 may be tilted with respect to the Z-axis direction. In other words, the side surface 20s of the gate electrode 20 may have a tapered configuration. For example, the width of the upper portion of the gate electrode 20 along a direction perpendicular to the Z-axis direction is narrower than the width of the lower portion of the gate electrode 20 along the direction. For example, the gate insulation layer 25 covers the side surface 20s of the gate electrode 20.

It is favorable for the angle between the X-Y plane and the side surface 20s of the gate electrode 20 to be, for example, not less than 10 degrees and not more than 40 degrees. The coverability of the side surface 20s of the gate electrode 20 with a film formed on the gate electrode 20 is improved by the side surface 20s having a tapered configuration. For example, leak current can be suppressed by improving the coverability.

The semiconductor layer 30 is separated from the gate electrode 20 in the Z-axis direction (the stacking direction from the substrate 10 toward the second insulating layer 12). In the example, the gate electrode 20 is disposed between the semiconductor layer 30 and the second insulating layer 12.

The semiconductor layer 30 has a first portion p1, a second portion p2, and a third portion p3. The second portion p2 is separated from the first portion p1 in the first direction. The first direction is perpendicular to the Z-axis direction (the stacking direction). The third portion p3 is provided between the first portion p1 and the second portion p2. The semiconductor layer 30 includes an oxide including at least one selected from indium, gallium, and zinc.

The semiconductor layer 30 is used as the channel layer of the thin film transistor 110. The semiconductor layer 30 may include, for example, an amorphous oxide semiconductor such as In—Ga—Zn—O (called IGZO hereinbelow), etc. The semiconductor layer 30 includes an amorphous portion. For the amorphous oxide semiconductor layer, a diffraction pattern indicating crystallinity is not observed when observing by, for example, transmission electron microscopy (TEM) or X-ray diffraction (XRD).

The thickness of the semiconductor layer 30 is, for example, not less than 5 nm and not more than 100 nm. Good electrical characteristics are obtained when the thickness of the semiconductor layer 30 is not less than 5 nm. The film properties and configuration of the semiconductor layer 30 can be observed by, for example, scanning electron microscopy (SEM), transmission electron microscopy (TEM), etc.

In the example, it is favorable for an outer edge 30r of the semiconductor layer 30 to be on the inner side of an outer edge 20r of the gate electrode 20 when projected onto the X-Y plane. Thereby, irregularities of the transistor characteristics caused by the electric field concentration portion that forms at the outer edge 20r of the gate electrode 20 can be suppressed.

The gate insulation layer 25 is provided between the gate electrode 20 and the semiconductor layer 30. The gate insulation layer 25 may include, for example, one selected from silicon oxide (e.g., $SiO_2$), silicon oxynitride ($SiO_xN_y$:H), and silicon nitride ($SiN_x$:H). The gate insulation layer 25 may include, for example, a stacked film of at least two films selected from silicon oxide, silicon oxynitride, and silicon nitride. The thickness of the gate insulation layer 25 is, for example, not less than 10 nm and not more than 500 nm.

The first conductive portion 41 is electrically connected to one selected from the first portion p1 and the second portion p2. The second conductive portion 42 is electrically connected to the other selected from the first portion p1 and the second portion p2. In the example, the first conductive portion 41 is electrically connected to the first portion p1; and the second conductive portion 42 is electrically connected to the second portion p2. The first conductive portion 41 is one selected from a source and a drain; and the second conductive portion 42 is the other selected from the source and the drain.

In the specification of the application, the state of being electrically connected includes the state in which two conductors are in physical contact, the state in which two conductors are connected by another conductor, and the state in which an electric element such as a transistor, a diode, etc., that connects two conductors can form a state in which a current flows in the two conductors.

The first conductive portion 41 and the second conductive portion 42 may include, for example, various conductive materials such as ITO (Indium Tin Oxide), a stacked film of a titanium (Ti) film/aluminum (Al) film/titanium (Ti) film, a stacked film of a molybdenum (Mo) film/aluminum (Al) film/ molybdenum (Mo) film, etc.

The resistance of the first portion p1 and the second portion p2 of the semiconductor layer 30 can be reduced by, for example, performing argon (Ar) plasma processing of the first portion p1 and the second portion p2. The portion having the reduced resistance may be used as at least a portion of the first conductive portion 41 and/or at least a portion of the second conductive portion 42.

The third insulating layer 50 covers a portion of the semiconductor layer 30 other than the first portion p1 and the second portion p2. The semiconductor layer 30 has a side surface 30s. The side surface 30s intersects the X-Y plane (a plane perpendicular to the stacking direction). The third insulating layer 50 covers, for example, an upper surface 30u of the semiconductor layer 30 and the side surface 30s of the semiconductor layer 30. The upper surface 30u is, for example, a portion other than the upper surface of the first portion p1 and the upper surface of the second portion p2.

According to the thin film transistor 110 having such a configuration, a highly reliable thin film transistor can be provided.

The characteristics of the thin film transistor that uses the oxide semiconductor easily degrade. For example, the characteristics of the thin film transistor degrade in the case where impurities (including, for example, water) move from the substrate 10 into the oxide semiconductor film (the semiconductor layer 30). For example, this phenomenon occurs particularly easily in the case where the substrate 10 includes organic substances (e.g., polyimide).

It is favorable for the first insulating layer 11 to be dense to suppress the movement of the impurities from the substrate 10 into the semiconductor layer 30. The first insulating layer 11 is caused to be dense by growing the first insulating layer 11 at a high temperature. Thereby, the movement of the impurities from the substrate 10 into the semiconductor layer 30 can be suppressed.

On the other hand, according to investigations of the inventor of the application, it was found that defects occur in the semiconductor layer 30 and the characteristics of the thin film transistor degrade when the hydrogen concentration of the semiconductor layer 30 becomes excessively low. High reliability is obtained when a certain amount of hydrogen is included inside the semiconductor layer 30. The hydrogen concentration inside the semiconductor layer 30 can be maintained at the desired value by supplying hydrogen to the semiconductor layer 30 from the insulating layers or electrodes provided around the semiconductor layer 30. Thereby, the occurrence of defects of the semiconductor layer 30 can be suppressed.

As recited above, the hydrogen concentration (the first concentration) of the first insulating layer 11 is reduced by using a dense film grown at a high temperature as the first insulating layer 11 to suppress the movement of the impurities from the substrate 10 into the semiconductor layer 30. Hydrogen does not desorb easily from such a first insulating layer 11; and it is difficult to sufficiently supply hydrogen from the first insulating layer 11 to the semiconductor layer 30.

In the embodiment, the second insulating layer 12 that has a high hydrogen concentration is provided on the first insulating layer 11. Thereby, the necessary hydrogen can be supplied from the second insulating layer 12 to the semiconductor layer 30; and the hydrogen concentration of the semiconductor layer 30 can be maintained at an appropriate value.

In the embodiment, the hydrogen concentration of the semiconductor layer 30 can be maintained appropriately while suppressing the movement of the impurities from the substrate 10 into the semiconductor layer 30; and the occurrence of defects can be suppressed. Thereby, a highly reliable thin film transistor can be provided.

The hydrogen concentration of the first insulating layer 11 is, for example, not less than $1 \times 10^{21}/cm^3$ and not more than $5 \times 10^{22}/cm^3$. The hydrogen concentration of the second insulating layer 12 is, for example, not less than $2 \times 10^{21}/cm^3$ and not more than $5 \times 10^{22}/cm^3$.

In the embodiment, the first insulating layer 11 is dense; and the second insulating layer 12 is less dense than the first insulating layer 11. For example, the density of the second insulating layer 12 is lower than the density of the first insulating layer 11. For example, the refractive index of the second insulating layer 12 is lower than the refractive index of the first insulating layer 11.

In the embodiment, for example, the first insulating layer 11 includes silicon nitride or silicon oxynitride. The second insulating layer 12 includes silicon oxide, silicon nitride, or silicon oxynitride. In the example, the refractive index of the second insulating layer 12 is lower than the refractive index of the first insulating layer 11.

In the embodiment, the hydrogen concentration of the gate insulation layer 25 may be lower than the second hydrogen concentration. In other words, the hydrogen concentration of the second insulating layer 12 may be higher than the hydrogen concentration of the gate insulation layer 25.

For example, in the thin film transistor 110 that uses the oxide semiconductor, high reliability is obtained by the interface between the gate insulation layer 25 and the semiconductor layer 30 being of high quality. For example, an insulating film that is formed at a high temperature is used as the gate insulation layer 25. Thereby, the quality of the interface between the gate insulation layer 25 and the semiconductor layer 30 increases. The concentration of the hydrogen included in the gate insulation layer 25 that is formed at the high temperature is low. It is difficult to supply hydrogen to the semiconductor layer 30 from such a gate insulation layer 25. In such a case, the necessary hydrogen can be supplied from the second insulating layer 12 to the semiconductor layer 30 by causing the hydrogen concentration of the second insulating layer 12 to be higher than the hydrogen concentration of the gate insulation layer 25. Thereby, the hydrogen concentration of the semiconductor layer 30 can be appropriate while increasing the quality of the interface between the gate insulation layer 25 and the semiconductor layer 30.

For example, the density of the second insulating layer 12 is lower than the density of the gate insulation layer 25. For example, the refractive index of the second insulating layer 12 is lower than the refractive index of the gate insulation layer 25.

Further, in the embodiment, the hydrogen concentration of the third insulating layer 50 may be lower than the second hydrogen concentration. In other words, the hydrogen concentration of the second insulating layer 12 may be higher than the hydrogen concentration of the third insulating layer 50.

For example, the density of the second insulating layer 12 is lower than the density of the third insulating layer 50. For example, the refractive index of the second insulating layer 12 is lower than the refractive index of the third insulating layer 50.

For example, the third insulating layer 50 is provided on the semiconductor layer 30 in contact with a portion of the semiconductor layer 30. The third insulating layer 50 functions as a channel protection layer. High reliability is obtained by increasing the quality of the third insulating layer 50. For example, a high-quality third insulating layer 50 is obtained by forming the third insulating layer 50 at a temperature not less than 200° C. and not more than 250° C. The concentration of the hydrogen included in such a third insulating layer 50 is low. It is difficult to supply hydrogen to the semiconductor layer 30 from such a third insulating layer 50. In such a case, the necessary hydrogen can be supplied from the second insulating layer 12 to the semiconductor layer 30 by causing the hydrogen concentration of the second insulating layer 12 to be higher than the hydrogen concentration of the third insulating layer 50. Thereby, the hydrogen concentration of the semiconductor layer 30 can be appropriate while increasing the quality of the third insulating layer 50 that functions as the channel protection layer.

Other than, for example, the hydrogen concentration that is included, the second insulating layer 12 may include the same material as the first insulating layer 11. The second insulating layer 12 may include a material that is different from the material of the first insulating layer 11.

Other than, for example, the hydrogen concentration that is included, the second insulating layer 12 may include the same material as the gate insulation layer 25. The second insulating layer 12 may include a material that is different from the material of the gate insulation layer 25.

Other than, for example, the hydrogen concentration that is included, the second insulating layer 12 may include the same material as the third insulating layer 50. The second insulating layer 12 may include a material that is different from the material of the third insulating layer 50.

In the example, the side surface 30s of the semiconductor layer 30 is tilted with respect to the Z-axis direction. In other words, the side surface 30s of the semiconductor layer 30 has a tapered configuration. For example, the width of the upper portion of the semiconductor layer 30 along a direction perpendicular to the Z-axis direction is narrower than the width of the lower portion of the semiconductor layer 30 along the direction. Thereby, the coverability of the semiconductor layer 30 with the third insulating layer 50 is improved; and high reliability is obtained.

An example of a method for manufacturing the thin film transistor 110 according to the embodiment will now be described.

FIG. 2A to FIG. 2H are schematic cross-sectional views in order of the processes, showing the method for manufacturing the thin film transistor according to the first embodiment.

These drawings are cross-sectional views corresponding to the cross section along line A1-A2 of FIG. 1A.

Figure 2A:
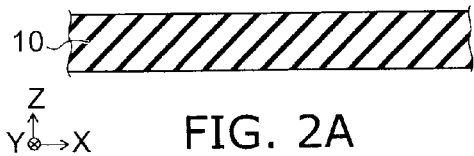
FIG. 2A to FIG. 2H are schematic cross-sectional views in order of the processes, showing a method for manufacturing the thin film transistor according to the first embodiment.

As shown in FIG. 2A, the substrate 10 is prepared. For example, a resin layer of polyimide, etc., may be formed on the surface of the substrate 10.

Figure 2E:
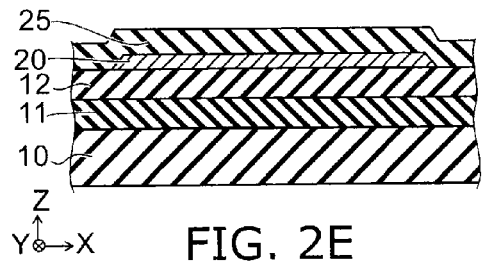
Figure 2B:

As shown in FIG. 2B, the first insulating layer 11 is formed on the substrate 10. For example, plasma CVD is used to form the first insulating layer 11. The film formation temperature of the first insulating layer 11 is, for example, not less than 300° C. and not more than 400° C.

Figure 2F:
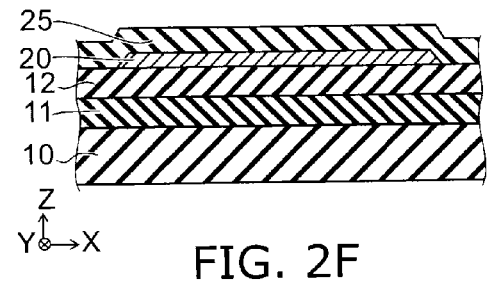
Figure 2C:
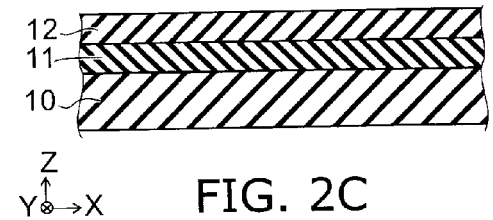

As shown in FIG. 2C, the second insulating layer 12 is formed on the first insulating layer 11. For example, PECVD is used to form the second insulating layer 12. The film formation temperature of the second insulating layer 12 is, for example, not less than 25° C. and not more than 230° C. It is more favorable for the film formation temperature of the second insulating layer 12 to be not less than 25° C. and not more than 200° C. Thus, the substrate unit 15 is formed.

Figure 2G:
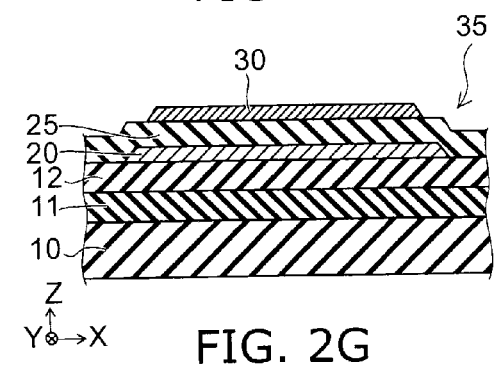

A structural body 35 that includes the gate electrode 20, the gate insulation layer 25, and the semiconductor layer 30 is formed on the second insulating layer 12 (referring to FIG. 2G).

Figure 2D:
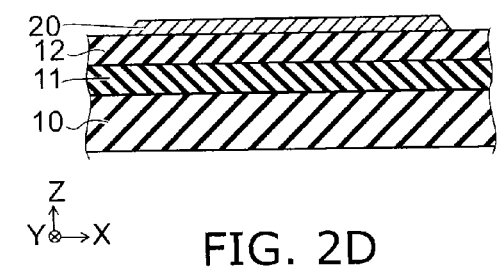

In the example as shown in FIG. 2D, the gate electrode 20 is formed on the second insulating layer 12. For example, the gate electrode 20 is formed by forming a conductive film that is used to form the gate electrode 20 and by patterning the conductive film by photolithography and etching. The side surface 20s of the gate electrode 20 may be formed in a tapered configuration.

As shown in FIG. 2E, the gate insulation layer 25 is formed to cover the gate electrode 20.

As shown in FIG. 2F, annealing is performed in an atmosphere containing hydrogen. The hydrogen concentration of the annealing is, for example, not less than 0.5% and not more than 10%. The temperature of the annealing is, for example, not less than 160° C. and not more than 300° C.

As shown in FIG. 2G, the semiconductor layer 30 is formed on the gate insulation layer 25. Thereby, the structural body 35 that includes the gate electrode 20, the gate insulation layer 25, and the semiconductor layer 30 is formed.

Figure 2H:
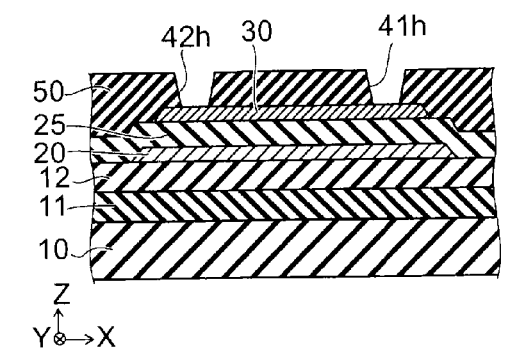

As shown in FIG. 2H, an insulating film that is used to form the third insulating layer 50 is formed on the semiconductor layer 30; a first hole 41h is made to reach the first portion p1 of the semiconductor layer 30; and a second hole 42h is made to reach the second portion p2 of the semiconductor layer 30. Thereby, the third insulating layer 50 is formed.

The third insulating layer 50 that is used to form the channel protection layer of the semiconductor layer 30 may include, for example, a material having a higher acid resistance than the semiconductor layer 30. The third insulating layer 50 may include, for example, silicon oxide.

Annealing is performed after the formation of the third insulating layer 50. The annealing may be implemented after forming the insulating film that is used to form the third insulating layer 50 and prior to making the first hole 41h and the second hole 42h. The annealing may be performed after making the first hole 41h and the second hole 42h. The temperature of the annealing is not less than 200° C. and not more than 400° C. It is favorable for the annealing to be performed in an inert gas atmosphere. The time of the annealing is, for example, not less than 30 minutes and not more than 5 hours. For example, the defects of the interface between the semiconductor layer 30 and the gate insulation layer 25 can be reduced by the annealing.

The first conductive portion 41 and the second conductive portion 42 are formed by filling a conductive material into the first hole 41h and the second hole 42h, respectively.

Annealing is performed after forming the first conductive portion 41 and the second conductive portion 42. For example, process damage can be removed by this annealing. It is favorable for the temperature of this annealing to be lower than the annealing temperature after the formation of the third insulating layer 50 (the channel protection layer). The temperature of the annealing after the formation of the first conductive portion 41 and the second conductive portion 42 is, for example, not less than 250° C. and not more than 300° C. When the temperature of the annealing after the formation of the first conductive portion 41 and the second conductive portion 42 is not less than 300° C., for example, there are cases where the metal that is used as the first conductive portion 41 and the second conductive portion 42 reacts with the semiconductor layer 30; the metal diffuses inside the semiconductor layer 30; and the reliability degrades. It is favorable for the annealing after the formation of the first conductive portion 41 and the second conductive portion 42 to be performed in, for example, an inert gas atmosphere.

Thus, the thin film transistor 110 can be formed.

Examples of characteristics of thin film transistors will now be described.

Figure 3A:
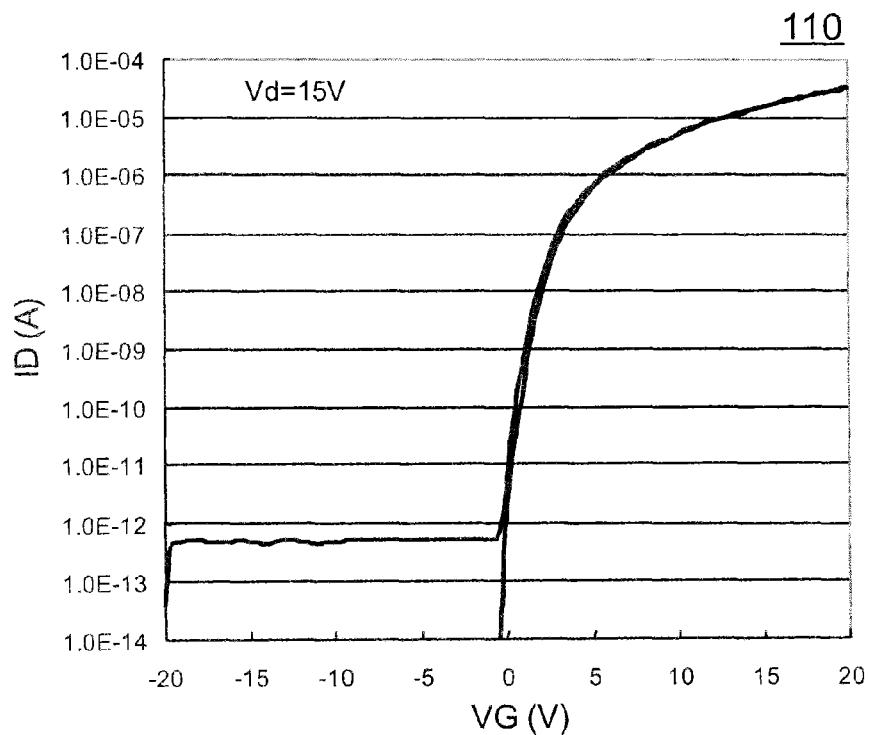
FIG. 3A and FIG. 3B are graphs showing characteristics of thin film transistors.
Figure 3B:
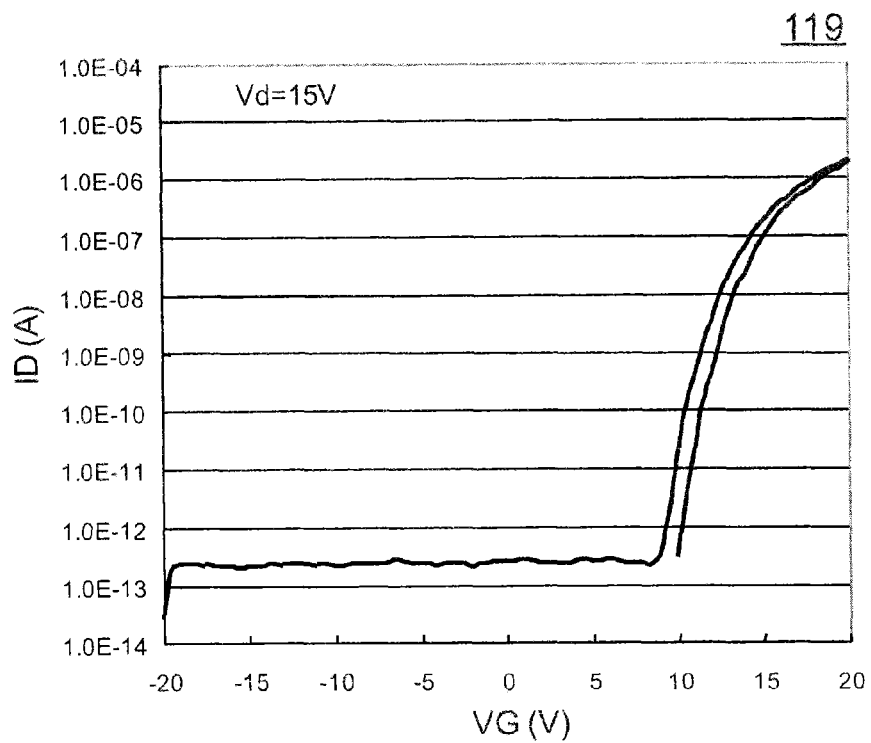

FIG. 3A and FIG. 3B are graphs showing characteristics of thin film transistors.

FIG. 3A shows the characteristics of the thin film transistor 110 according to the embodiment. FIG. 3B shows the characteristics of a thin film transistor 119 (having a configuration that is not shown) of a reference example. The second insulating layer 12 of the thin film transistor 119 is formed using conditions similar to those of the first insulating layer 11. In other words, the hydrogen concentration of the second insulating layer 12 of the thin film transistor 119 is as low as that of the first insulating layer 11. Also, the hydrogen concentration of the second insulating layer 12 of the thin film transistor 119 is lower than the hydrogen concentration of the gate insulation layer 25. In these drawings, the horizontal axis is a gate voltage VG (volts (V)). The vertical axis is a source-drain current ID (amperes (A)). A drain voltage Vd is 15 V for these characteristics.

As shown in FIG. 3B, the threshold voltage of the thin film transistor 119 is about 10 V. After a BTS test, the threshold voltage of the thin film transistor 119 shifts not less than 1 V toward the positive side. Thus, in the thin film transistor 119 of the reference example, the threshold voltage of the initial characteristics is high; and the characteristic fluctuation after the BTS test is large.

Conversely, the threshold voltage of the thin film transistor 110 according to the embodiment is about 0 V. After a BTS test, the threshold voltage of the thin film transistor 110 is substantially the same as that of the initial characteristics. Thus, in the thin film transistor 110 according to the embodiment, the threshold voltage of the initial characteristics is low; and the characteristic fluctuation after the BTS test is small.

The thin film transistor 110 described above has a bottom-gate structure. The embodiment is applicable also to a top-gate structure as described below.

Second Embodiment

Figure 4A:
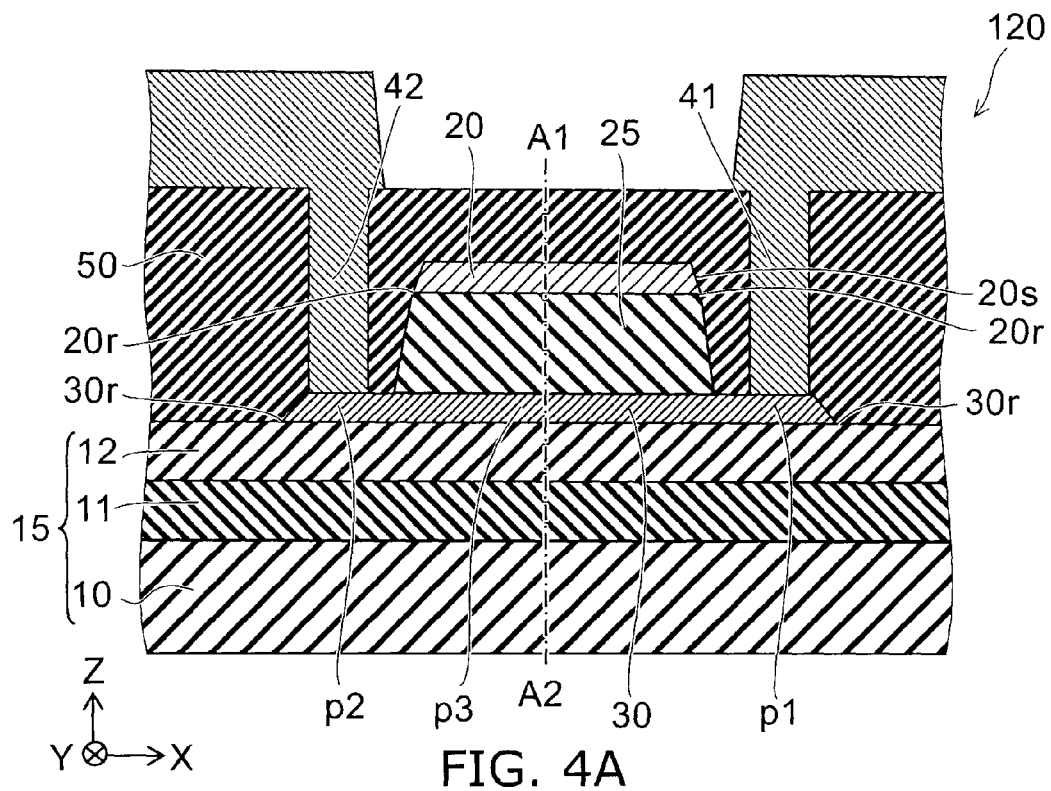
FIG. 4A and FIG. 4B are schematic cross-sectional views showing a thin film transistor according to a second embodiment.
Figure 4B:
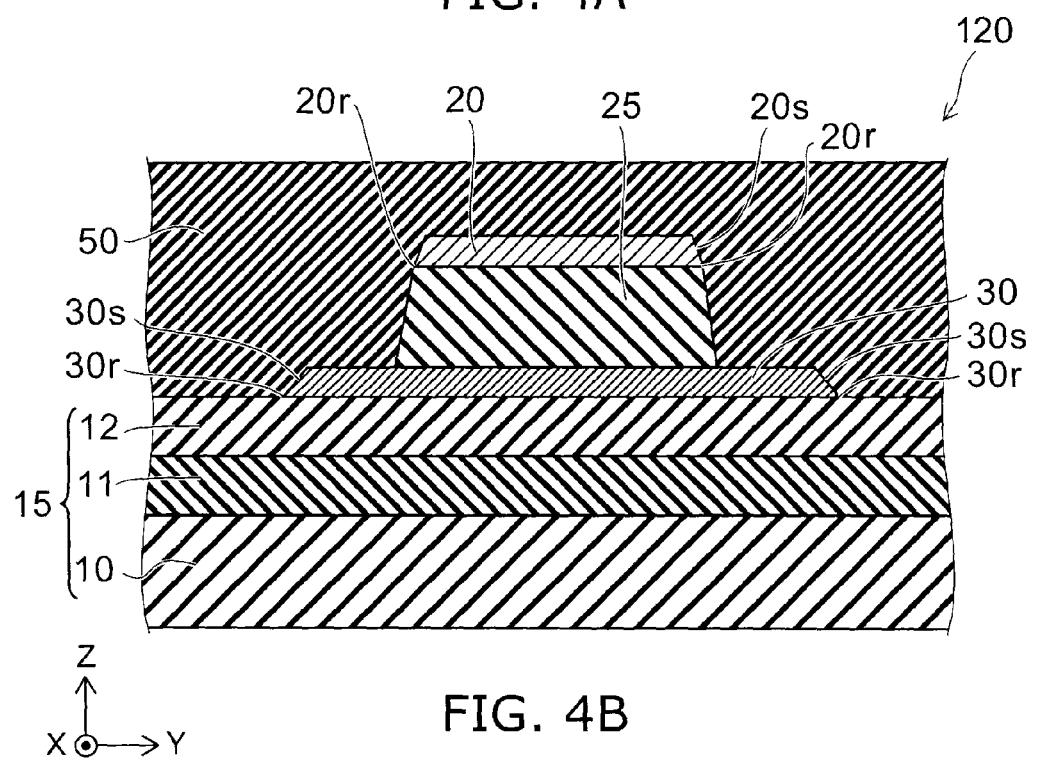

FIG. 4A and FIG. 4B are schematic cross-sectional views showing a thin film transistor according to a second embodiment.

FIG. 4B is a cross-sectional view along line A1-A2 of FIG. 4A.

As shown in FIG. 4A and FIG. 4B, the thin film transistor 120 according to the second embodiment also includes the substrate unit 15, the gate electrode 20, the semiconductor layer 30, the gate insulation layer 25, the first conductive portion 41, the second conductive portion 42, and the third insulating layer 50. The substrate unit 15 includes the substrate 10, the first insulating layer 11, and the second insulating layer 12. In the thin film transistor 120 as well, the gate electrode 20, the semiconductor layer 30, the gate insulation layer 25, the first conductive portion 41, the second conductive portion 42, and the third insulating layer 50 are provided on the substrate unit 15.

In the thin film transistor 120, the semiconductor layer 30 is disposed between the gate electrode 20 and the substrate unit 15 (the second insulating layer 12). The semiconductor layer 30 is provided on the second insulating layer 12; the gate insulation layer 25 is provided on the semiconductor layer 30; and the gate electrode 20 is provided on the gate insulation layer 25. In other words, the thin film transistor 120 has a top-gate structure.

The semiconductor layer 30 contacts the second insulating layer 12. The gate insulation layer 25 is provided between the semiconductor layer 30 and the gate electrode 20 and contacts the semiconductor layer 30 and the gate electrode 20.

In the example, the semiconductor layer 30 has the first portion p1, the second portion p2 separated from the first portion p1 in the first direction (e.g., the X-axis direction), and the third portion p3 provided between the first portion p1 and the second portion p2.

The first conductive portion 41 is electrically connected to the first portion p1. The second conductive portion 42 is electrically connected to the second portion p2. The third insulating layer 50 covers a portion of the semiconductor layer 30 other than the first portion p1 and the second portion p2.

The semiconductor layer 30 has the side surface 30s that intersects the X-Y plane (a plane perpendicular to the Z-axis direction which is the stacking direction). In the example as well, the third insulating layer 50 covers the side surface 30s of the semiconductor layer 30. Thereby, the fluctuation of the characteristics of the semiconductor layer 30 can be suppressed easily.

The configurations and materials described in regard to the first embodiment are applicable to the substrate unit 15, the semiconductor layer 30, the gate insulation layer 25, the gate electrode 20, the first conductive portion 41, the second conductive portion 42, and the third insulating layer 50 of the thin film transistor 120.

In the thin film transistor 120 as well, the hydrogen concentration of the second insulating layer 12 is higher than the hydrogen concentration of the first insulating layer 11.

In the embodiment as well, the first insulating layer 11 is dense because the first insulating layer 11 is grown at a high temperature; and the movement of the impurities from the substrate 10 into the semiconductor layer 30 can be suppressed. In such a case, the hydrogen concentration of the first insulating layer 11 decreases. By providing the second insulating layer 12 that has a high hydrogen concentration on such a first insulating layer 11, the necessary hydrogen can be supplied from the second insulating layer 12 to the semiconductor layer 30; and the hydrogen concentration of the semiconductor layer 30 can be maintained at an appropriate value.

In the embodiment as well, the hydrogen concentration of the semiconductor layer 30 can be maintained appropriately while suppressing the movement of the impurities from the substrate 10 into the semiconductor layer 30; and the occurrence of defects can be suppressed. Thereby, a highly reliable thin film transistor can be provided.

In the embodiment as well, the hydrogen concentration of the second insulating layer 12 may be set to be higher than the hydrogen concentration of the gate insulation layer 25. Thereby, the necessary hydrogen can be supplied from the second insulating layer 12 to the semiconductor layer 30. Thereby, the hydrogen concentration of the semiconductor layer 30 can be appropriate while increasing the quality of the interface between the gate insulation layer 25 and the semiconductor layer 30.

For example, the density of the second insulating layer 12 is lower than the density of the gate insulation layer 25. For example, the refractive index of the second insulating layer 12 is lower than the refractive index of the gate insulation layer 25.

In the embodiment as well, the hydrogen concentration of the second insulating layer 12 may be higher than the hydrogen concentration of the third insulating layer 50. For example, the density of the second insulating layer 12 is lower than the density of the third insulating layer 50. For example, the refractive index of the second insulating layer 12 is lower than the refractive index of the third insulating layer 50.

In the example as well, the side surface 30s of the semiconductor layer 30 is tilted with respect to the Z-axis direction. The side surface 20s of the gate electrode 20 also is tilted with respect to the Z-axis direction. Thereby, the coverability with the layers provided on the semiconductor layer 30 and the gate electrode 20 are good; and the reliability can be increased further.

An example of a method for manufacturing the thin film transistor 120 according to the embodiment will now be described.

FIG. 5A to FIG. 5H are schematic cross-sectional views in order of the processes, showing the method for manufacturing the thin film transistor according to the second embodiment.

These drawings are cross-sectional views corresponding to the cross section along line A1-A2 of FIG. 4A.

Figure 5A:
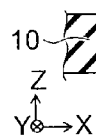
FIG. 5A to FIG. 5H are schematic cross-sectional views in order of the processes, showing a method for manufacturing the thin film transistor according to the second embodiment.

As shown in FIG. 5A, the substrate 10 is prepared.

Figure 5B:
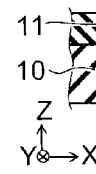

As shown in FIG. 5B, the first insulating layer 11 is formed on the substrate 10.

Figure 5C:
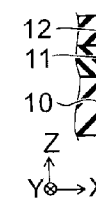

As shown in FIG. 5C, the second insulating layer 12 is formed on the first insulating layer 11. The methods and conditions described in regard to the first embodiment may be used to form the substrate 10, the first insulating layer 11, and the second insulating layer 12.

Figure 5D:
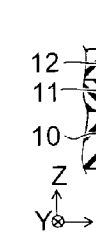
Figure 5E:
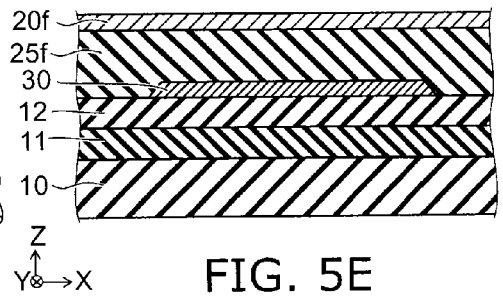
Figure 5F:
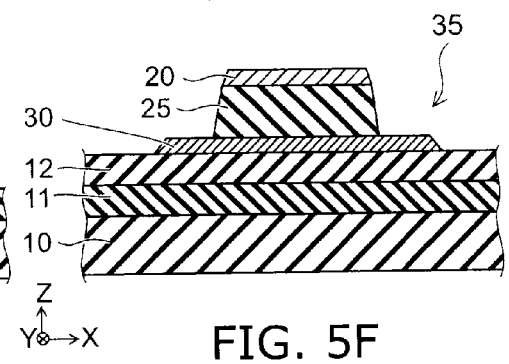

The structural body 35 that includes the gate electrode 20, the gate insulation layer 25, and the semiconductor layer 30 is formed on the second insulating layer 12 (referring to FIG. 5F).

In the example as shown in FIG. 5D, the semiconductor layer 30 is formed on the second insulating layer 12.

As shown in FIG. 5E, a gate insulating film 25f that is used to form the gate insulation layer 25 is formed to cover the semiconductor layer 30; and a gate electrode film 20f that is used to form the gate electrode 20 is formed on the gate insulation layer 25.

As shown in FIG. 5F, the gate electrode 20 and the gate insulation layer 25 are formed by patterning the gate electrode film 20f and the gate insulating film 25f, respectively. Thereby, the structural body 35 that includes the gate electrode 20, the gate insulation layer 25, and the semiconductor layer 30 is formed.

Figure 5G:

As shown in FIG. 5G, a third insulating film 50f that is used to form the third insulating layer 50 is formed to cover the gate electrode 20.

Figure 5H:
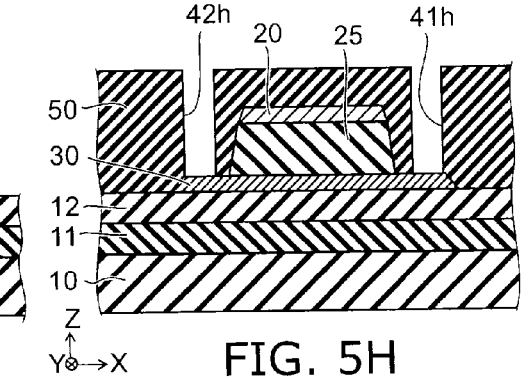

As shown in FIG. 5H, the first hole 41h is made in the third insulating film 50f to reach the first portion p1 of the semiconductor layer 30; and the second hole 42h is made in the third insulating film 50f to reach the second portion p2 of the semiconductor layer 30. Thereby, the third insulating layer 50 is formed.

The third insulating layer 50 may include, for example, silicon oxide. Annealing is performed after the formation of the third insulating layer 50 or the third insulating film 50f. The annealing may be implemented prior to making the first hole 41h and the second hole 42h. The annealing may be performed after making the first hole 41h and the second hole 42h. The temperature of the annealing is not less than 200° C. and not more than 400° C. It is favorable for the annealing to be performed in an inert gas atmosphere. The annealing time is, for example, not less than 30 minutes and not more than 5 hours.

The first conductive portion 41 and the second conductive portion 42 are formed by filling a conductive material into the first hole 41h and the second hole 42h, respectively. In the example as well, annealing is performed after the formation of the first conductive portion 41 and the second conductive portion 42. It is favorable for the temperature of this annealing to be, for example, lower than the annealing temperature after the formation of the third insulating layer 50. The temperature of the annealing after the formation of the first conductive portion 41 and the second conductive portion 42 is, for example, not less than 250° C. and not more than 300° C. It is favorable for the annealing after the formation of the first conductive portion 41 and the second conductive portion 42 to be performed in, for example, an inert gas atmosphere.

Thus, the thin film transistor 120 can be formed.

In the thin film transistor 120 according to the embodiment as well, the threshold voltage is about 0 V; and the threshold voltage of the thin film transistor 110 after the BTS test is substantially the same as that of the initial characteristics. Thus, in the thin film transistor 120 according to the embodiment as well, the threshold voltage of the initial characteristics is low; and the characteristic fluctuation after the BTS test is small.

Third Embodiment

The embodiment relates to a display device that uses the thin film transistor according to the first embodiment.

Figure 6:
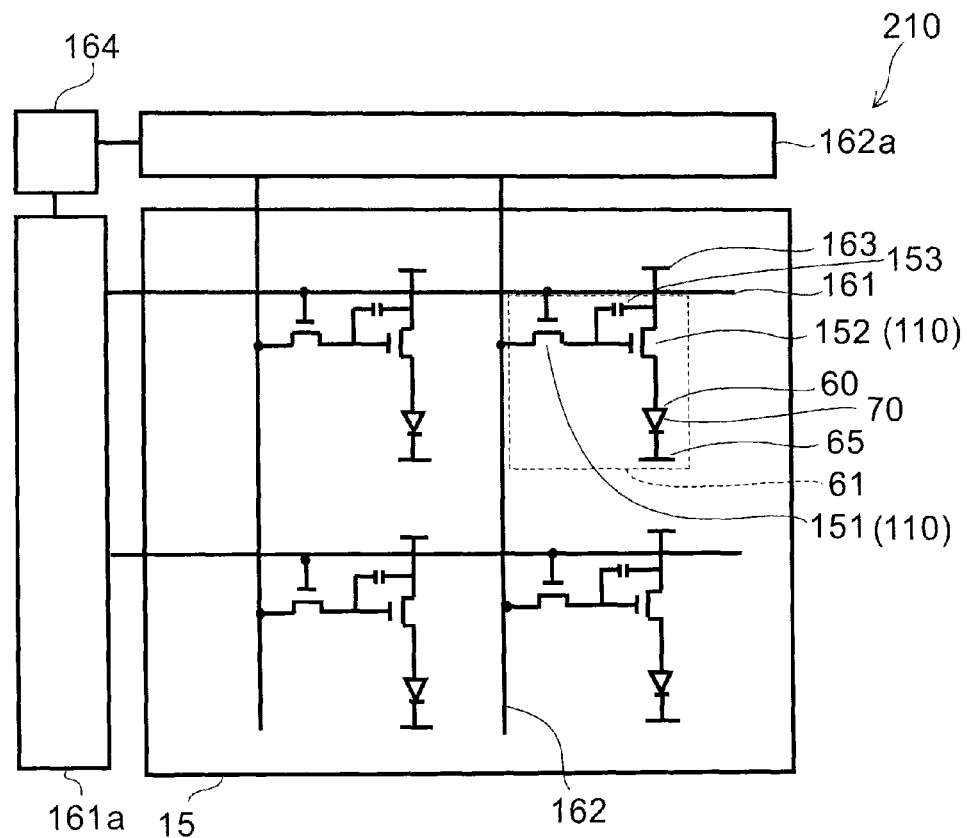
FIG. 6 is a schematic view showing a display device according to a third embodiment.

FIG. 6 is a schematic view showing the display device according to the third embodiment.

As shown in FIG. 6, the display device 210 according to the embodiment includes the substrate unit 15, the multiple thin film transistors 110, multiple pixel electrodes 60, and a display layer 70. The multiple thin film transistors 110, the multiple pixel electrodes 60, and the display layer 70 are provided on the substrate unit 15.

In the example, multiple control lines 161, multiple signal lines 162, and a power supply line 163 also are provided on the substrate unit 15. The control lines 161 intersect the signal lines 162. A pixel 61 is provided at each of the intersections between the multiple control lines 161 and the multiple signal lines 162.

A program transistor 151, a drive transistor 152, a capacitor 153, and the pixel electrode 60 are provided in one pixel 61. For example, the display layer 70 is provided between the pixel electrode 60 and an opposing electrode 65. For example, an organic light emitting layer may be used as the display layer 70.

The thin film transistor 110 described in regard to the first embodiment may be used as the program transistor 151 and the drive transistor 152. However, because multiple thin film transistors are provided on one substrate unit 15 in the display device 210, the thin film transistors are taken to be entities that are separate from the substrate unit 15.

One pixel will now be described.

The signal line 162 is connected to the source of the program transistor 151. The control line 161 is connected to the gate of the program transistor 151. The gate of the drive transistor 152 is connected to the drain of the program transistor 151. The drain of the drive transistor 152 is connected to the power supply line 163. The power supply line 163 is set to have, for example, a power supply potential Vdd. One end of the capacitor 153 is connected to the gate of the drive transistor 152; and the other end of the capacitor 153 is connected to the drain of the drive transistor 152. The pixel electrode 60 is connected to the source of the drive transistor 152. The display layer 70 is provided between the pixel electrode 60 and the opposing electrode 65. In the case where an organic light emitting layer is used as the display layer 70, for example, the pixel electrode 60 is used as the anode; and the opposing electrode 65 is used as the cathode.

The control lines 161 are connected to a control line drive unit 161a. The signal lines 162 are connected to a signal line drive unit 162a. The control line drive unit 161a and the signal line drive unit 162a are connected to a control unit 164. At least a portion of the control line drive unit 161a, the signal line drive unit 162a, and the control unit 164 may be provided on the substrate unit 15 or may be provided separately from the substrate unit 15.

A signal is supplied sequentially to the control lines 161 to operate the program transistor 151 and the drive transistor 152; and a charge corresponding to the signal supplied to the signal line 162 is supplied to the pixel electrode 60. The charge is supplied to the pixel electrode 60 via the drive transistor 152. For example, the display layer 70 emits light according to the charge of the pixel electrode 60. The optical characteristics of the display layer 70 may change according to the charge of the pixel electrode 60. Thereby, a display is performed.

An example of the configuration of one pixel will now be described further.

Figure 7:
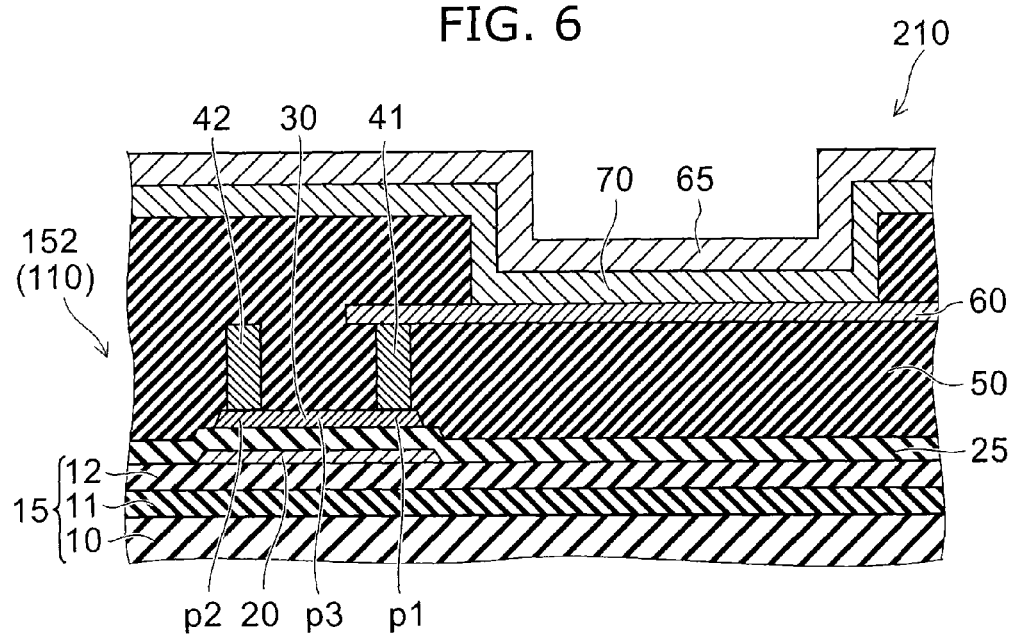
FIG. 7 is a schematic cross-sectional view showing the display device according to the third embodiment.

FIG. 7 is a schematic cross-sectional view showing the display device according to the third embodiment.

As shown in FIG. 7, the substrate 10, the first insulating layer 11, and the second insulating layer 12 are provided in the substrate unit 15. The configurations and materials described in regard to the first embodiment are applicable to the substrate 10, the first insulating layer 11, the second insulating layer 12.

The thin film transistor 110 (each of the multiple thin film transistors 110) includes the gate electrode 20, the semiconductor layer 30, the gate insulation layer 25, the first conductive portion 41, the second conductive portion 42, and the third insulating layer 50.

The gate electrode 20 is provided on the second insulating layer 12. In the example, the gate electrode 20 contacts the second insulating layer 12. The semiconductor layer 30 is separated from the gate electrode 20 in the stacking direction. The semiconductor layer 30 has the first portion p1, the second portion p2, and the third portion p3. The semiconductor layer 30 includes an oxide including at least one selected from indium, gallium, and zinc. The gate insulation layer 25 is provided between the gate electrode 20 and the semiconductor layer 30.

The first conductive portion 41 is electrically connected to the first portion p1. The second conductive portion 42 is electrically connected to the second portion p2. The third insulating layer 50 covers a portion of the semiconductor layer 30 other than the first portion p1 and the second portion p2.

In the display device 210, the thin film transistor 110 having a bottom-gate structure is used.

The multiple pixel electrodes 60 are connected respectively to one selected from the first conductive portion 41 and the second conductive portion 42 of each of the multiple thin film transistors 110.

The display layer 70 has a light emission or one selected from a change of at least one optical characteristic selected from absorptivity, reflectivity, scattering properties, refractive properties, and optical rotatory properties occurring according to the charge supplied to each of the multiple pixel electrodes 60 via each of the multiple thin film transistors 110.

The pixel electrode 60 includes, for example, ITO (Indium Tin Oxide), etc.

For example, an organic light emitting layer is used as the display layer 70. For example, a liquid crystal layer may be used as the display layer 70.

According to the display device 210, a highly reliable display device can be provided.

Fourth Embodiment

The embodiment relates to a display device that uses the thin film transistor according to the second embodiment (a thin film transistor having a top-gate structure). The display device according to the embodiment also may have the configuration described in regard to FIG. 6. The thin film transistor 120 described in regard to the second embodiment may be used as the program transistor 151 and the drive transistor 152. Because multiple thin film transistors are provided on one substrate unit 15 in the display device, the thin film transistors are taken to be entities that are separate from the substrate unit 15.

An example of the configuration of one pixel will now be described further.

Figure 8:
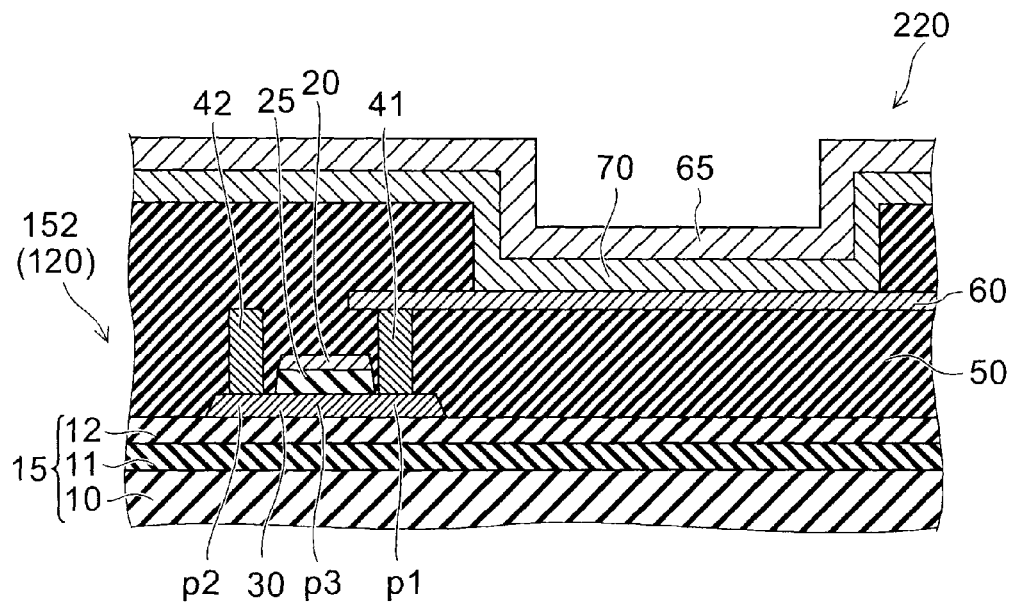
FIG. 8 is a schematic cross-sectional view showing a display device according to a fourth embodiment.

FIG. 8 is a schematic cross-sectional view showing the display device according to the fourth embodiment.

In the display device 220 according to the embodiment as shown in FIG. 8, the thin film transistor 120 described in regard to the second embodiment is provided on the substrate unit 15. The thin film transistor 120 (each of the multiple thin film transistors 120) includes the gate electrode 20, the semiconductor layer 30, the gate insulation layer 25, the first conductive portion 41, the second conductive portion 42, and the third insulating layer 50.

The semiconductor layer 30 is provided on the second insulating layer 12. In the example, the semiconductor layer 30 contacts the second insulating layer 12. The gate insulation layer 25 is provided on the gate electrode 20; and the gate electrode 20 is provided on the gate insulation layer 25. The first conductive portion 41 is electrically connected to the first portion p1 of the semiconductor layer 30. The second conductive portion 42 is electrically connected to the second portion p2 of the semiconductor layer 30. The third insulating layer 50 covers a portion of the semiconductor layer 30 other than the first portion p1 and the second portion p2.

The multiple pixel electrodes 60 and the display layer 70 of the display device 220 may be similar to those of the display device 210.

According to the display device 220, a highly reliable display device can be provided.

Fifth Embodiment

The embodiment relates to a method for manufacturing the thin film transistor.

Figure 9:
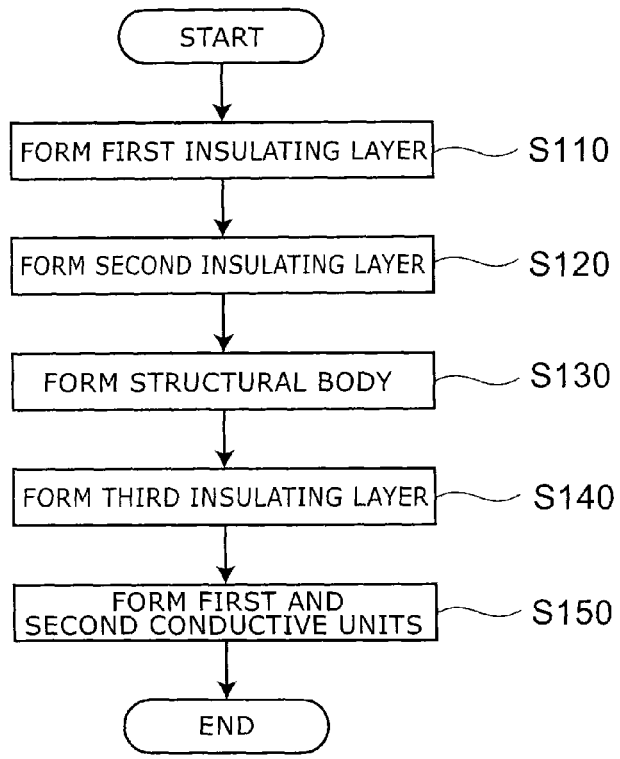
FIG. 9 is a flowchart showing a method for manufacturing a thin film transistor according to a fifth embodiment.

FIG. 9 is a flowchart showing the method for manufacturing the thin film transistor according to the fifth embodiment.

As shown in FIG. 9, the manufacturing method according to the embodiment includes a process (step S110) of forming the first insulating layer 11 having a first hydrogen concentration on the substrate 10 at a first temperature.

The manufacturing method includes a process (step S120) of forming the second insulating layer 12 having a second hydrogen concentration that is higher than the first hydrogen concentration on the first insulating layer 11 at a second temperature that is lower than the first temperature.

The manufacturing method includes a process (step S130) of forming the structural body 35. The structural body 35 includes the gate electrode 20, the semiconductor layer 30, and the gate insulation layer 25 provided between the gate electrode 20 and the semiconductor layer 30, where the gate electrode 20 is provided on the second insulating layer 12, the semiconductor layer 30 is a semiconductor layer of an oxide including at least one selected from indium, gallium, and zinc separated from the gate electrode 20 in the stacking direction (the Z-axis direction) from the substrate 10 toward the second insulating layer 12, and the semiconductor layer 30 has the first portion p1, the second portion p2 separated from the first portion p1 in a first direction perpendicular to the stacking direction, and the third portion p3 provided between the first portion p1 and the second portion p2.

The manufacturing method includes a process (step S140) of forming the third insulating layer 50 to cover a portion of the semiconductor layer 30 other than the first portion p1 and the second portion p2.

The manufacturing method includes a process (step S150) of forming the first conductive portion 41 that is electrically connected to one selected from the first portion p1 and the second portion p2 and forming the second conductive portion 42 that is electrically connected to the other selected from the first portion p1 and the second portion p2.

According to the embodiment, a method for manufacturing a highly reliable thin film transistor can be provided.

An example of the process (step S130) of forming the structural body 35 will now be described.

Figure 10:
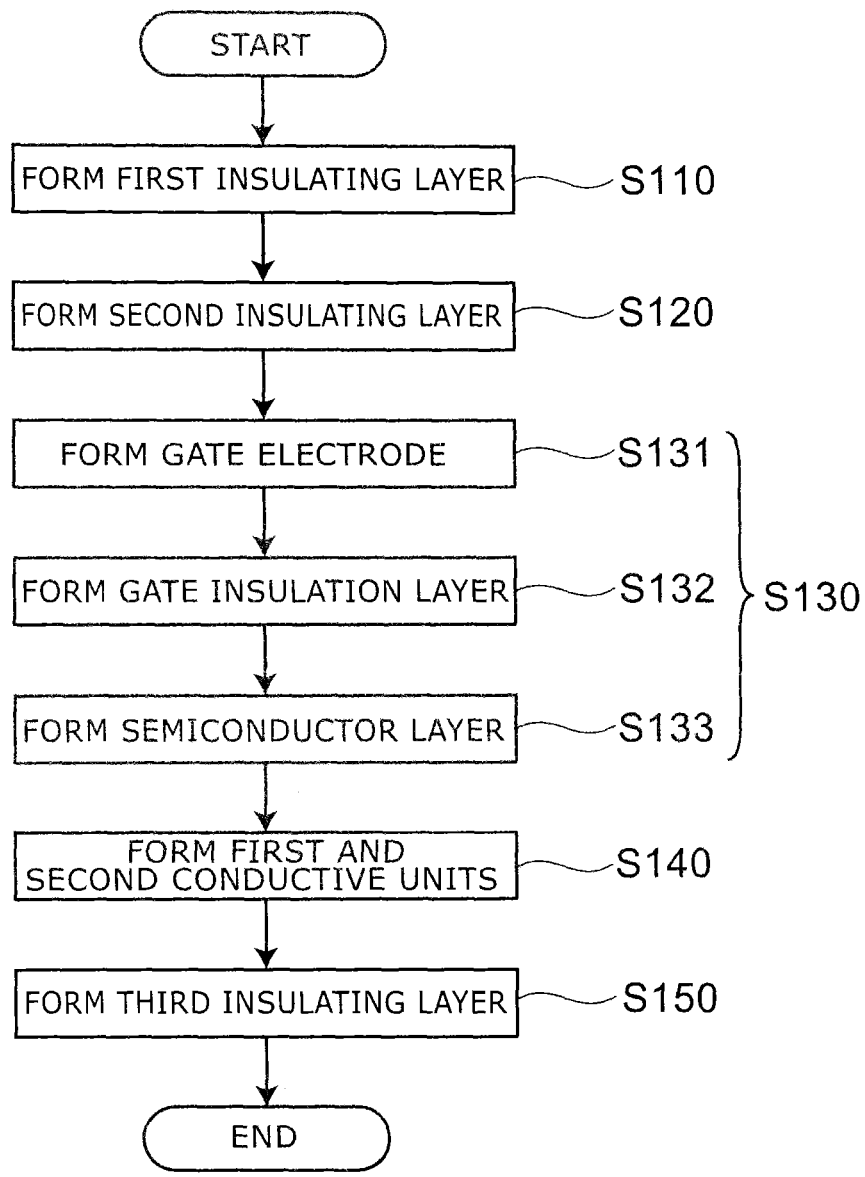
FIG. 10 is a flowchart showing another method for manufacturing the thin film transistor according to the fifth embodiment.

FIG. 10 is a flowchart showing another method for manufacturing the thin film transistor according to the fifth embodiment.

As shown in FIG. 10, the process (step S130) of forming the structural body 35 includes a process (step S131) of forming the gate electrode 20 on the second insulating layer 12.

The process (step S130) of forming the structural body 35 includes a process (step S132) of forming the gate insulation layer 25 on the gate electrode 20.

The process (step S130) of forming the structural body 35 further includes a process (step S133) of forming the semiconductor layer 30 on the gate insulation layer 25.

The manufacturing method includes performing, for example, the processing described in regard to FIG. 2A to FIG. 2H.

Figure 11:
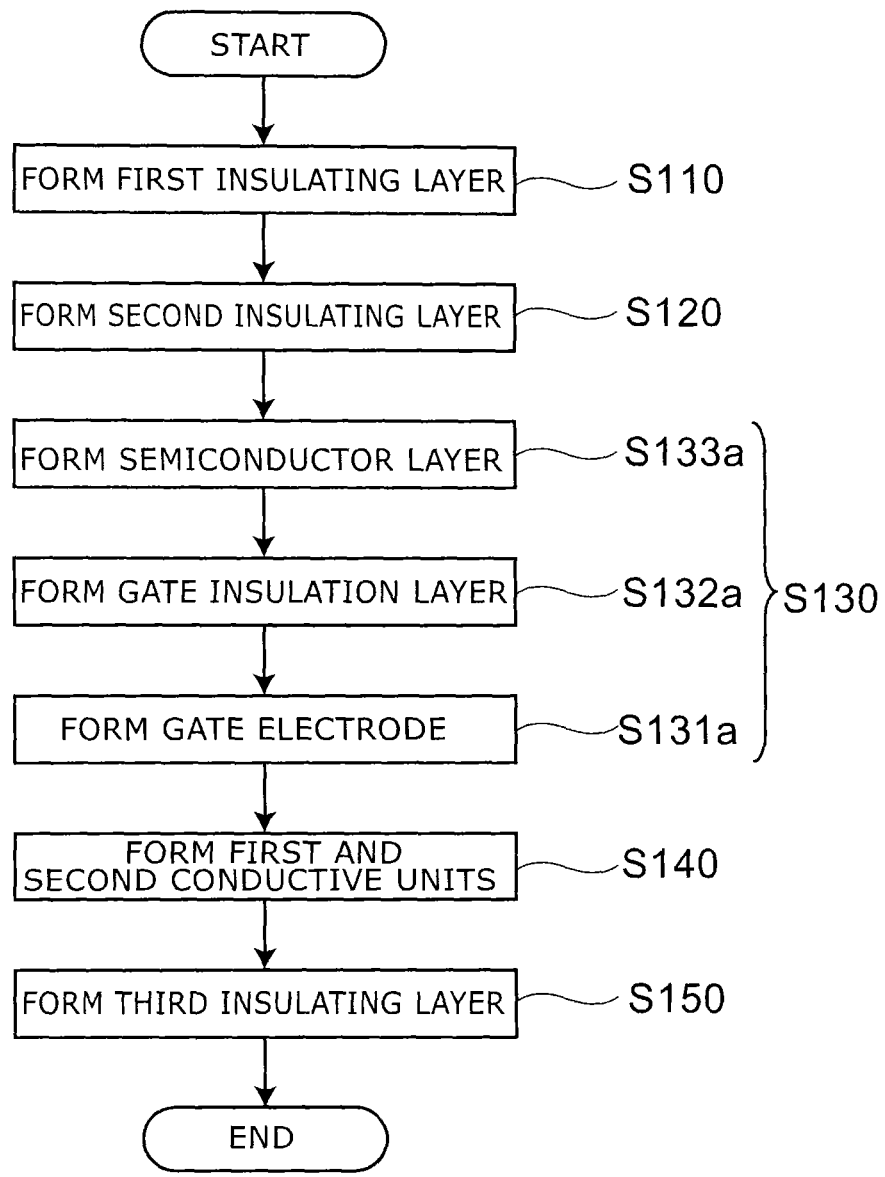
FIG. 11 is a flowchart showing another method for manufacturing the thin film transistor according to the fifth embodiment.

FIG. 11 is a flowchart showing another method for manufacturing the thin film transistor according to the fifth embodiment.

As shown in FIG. 10, the process (step S130) of forming the structural body 35 includes a process (step S133a) of forming the semiconductor layer 30 on the second insulating layer 12.

The process (step S130) of forming the structural body includes a process (step S132a) of forming the gate insulation layer 25 on the semiconductor layer 30.

The process (step S130) of forming the structural body 35 further includes a process (step S131a) of forming the gate electrode 20 on the gate insulation layer 25.

The manufacturing method includes performing, for example, the processing described in regard to FIG. 5A to FIG. 5H.

Sixth Embodiment

The embodiment relates to a method for manufacturing a display device.

Figure 12:
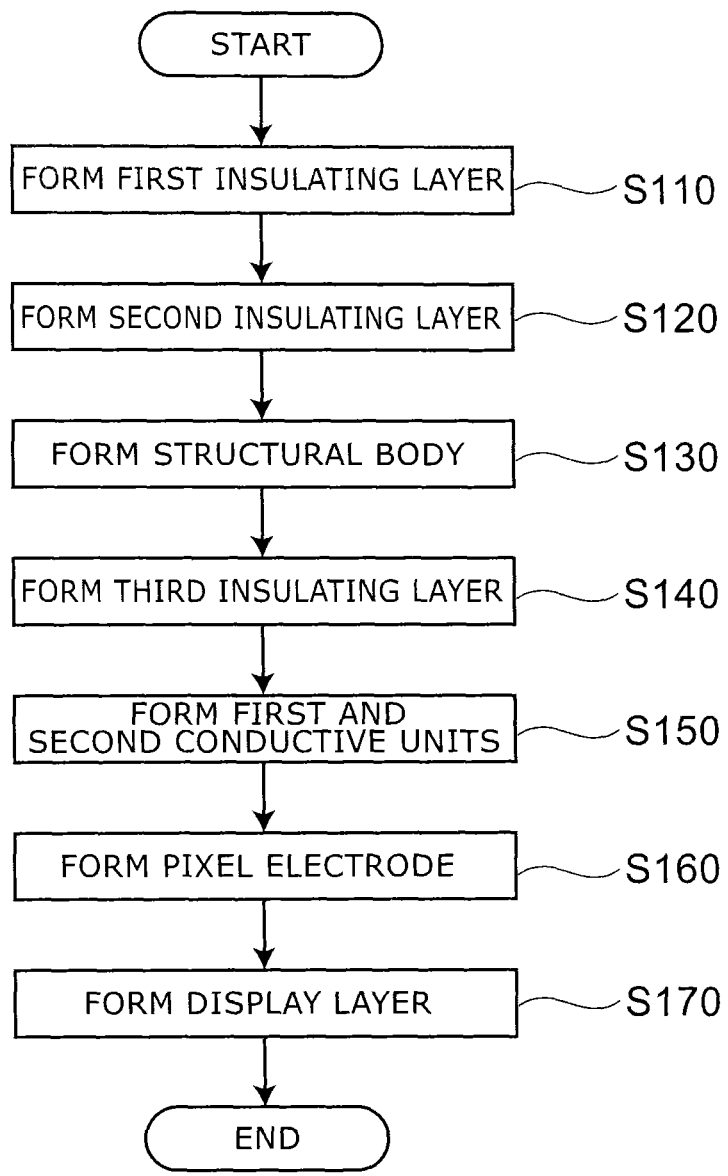
FIG. 12 is a flowchart showing a method for manufacturing a display device according to a sixth embodiment.

FIG. 12 is a flowchart showing the method for manufacturing the display device according to the sixth embodiment.

As shown in FIG. 12, the manufacturing method includes steps S110 to S150 described in regard to FIG. 9.

In other words, the manufacturing method includes the process (step S110) of forming the first insulating layer 11 having the first hydrogen concentration on the substrate 10 at the first temperature.

The manufacturing method includes the process (step S120) of forming the second insulating layer 12 having the second hydrogen concentration that is higher than the first hydrogen concentration on the first insulating layer 11 at the second temperature that is lower than the first temperature. Thereby, the substrate unit 15 that includes the substrate 10, the first insulating layer 11, and the second insulating layer 12 is formed.

Multiple thin film transistors are formed on the substrate unit 15. The process of forming the multiple thin film transistors includes the process (step S130) of forming the structural body 35, the process (step S140) of forming the third insulating layer 50, and the process (step S150) of forming the first conductive portion 41 and the second conductive portion 42.

The process of forming the structural body 35 may include the processing described in regard to FIG. 10 and FIG. 11.

The manufacturing method includes a process (step S160) of forming the multiple pixel electrodes 60 to be respectively connected to one selected from the first conductive portion 41 and the second conductive portion 42 of each of the multiple thin film transistors.

The manufacturing method includes a process (step S170) of forming the display layer 70 that has a light emission or one selected from a change of at least one optical characteristic selected from absorptivity, reflectivity, scattering properties, refractive properties, and optical rotatory properties occurring according to the potential of each of the multiple pixel electrodes 60.

According to the embodiment, a method for manufacturing a highly reliable display device can be provided.

According to the embodiments, a highly reliable display device, a highly reliable thin film transistor, a method for manufacturing the display device, and a method for manufacturing the thin film transistor can be provided.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components included in the thin film transistor such as the substrate, the first to third insulating layers, the gate electrode, the gate insulation layer, the semiconductor layer, and the first and second conductive portions, specific configurations of components included in the display device such as the pixel electrode, the display layer, etc., from known art; and such practice is within the scope of the invention to the extent that similar effects are obtained.

Further, any two or more components of the specific examples may be combined within the extent of technical feasibility and are included in the scope of the invention to the extent that the purport of the invention is included.

Moreover, all display devices, thin film transistors, methods for manufacturing the display devices and the methods for manufacturing the thin film transistors practicable by an appropriate design modification by one skilled in the art based on the display devices, the thin film transistors, the methods for manufacturing the display devices and the methods for manufacturing the thin film transistors described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A thin film transistor, comprising:
a substrate;
a first insulating layer having a first hydrogen concentration provided on the substrate;

a second insulating layer provided on the first insulating layer, the second insulating layer having a second hydrogen concentration higher than the first hydrogen concentration;

a gate electrode provided on the second insulating layer;

a semiconductor layer of an oxide including at least one selected from indium, gallium, and zinc separated from the gate electrode in a stacking direction from the substrate toward the second insulating layer, the semiconductor layer having a first portion, a second portion separated from the first portion in a first direction perpendicular to the stacking direction, and a third portion provided between the first portion and the second portion;

a gate insulation layer provided between the gate electrode and the semiconductor layer;

a first conductive portion electrically connected to one selected from the first portion and the second portion;

a second conductive portion electrically connected to other one selected from the first portion and the second portion; and a third insulating layer covering a portion of the semiconductor layer other than the first portion and the second portion.

2. A display device, comprising:

a substrate unit including the thin film transistor of claim 1;

a pixel electrode connected to one selected from the first conductive portion and the second conductive portion of the thin film transistor; and a display layer configured to have a light emission or a change of at least one optical characteristic selected from absorptivity, reflectivity, scattering properties, refractive properties, and optical rotatory properties occurring according to a charge supplied to the pixel electrode.

3. The device according to claim 2, wherein a refractive index of the second insulating layer is lower than a refractive index of the first insulating layer.

4. The device according to claim 2, wherein a density of the second insulating layer is lower than a density of the first insulating layer.

5. The device according to claim 2, wherein
the first insulating layer includes silicon nitride or silicon oxynitride,
the second insulating layer includes silicon oxide, silicon nitride, or silicon oxynitride, and
a refractive index of the second insulating layer is lower than a refractive index of the first insulating layer.

6. The device according to claim 2, wherein a hydrogen concentration of the gate insulation layer is lower than the second hydrogen concentration.

7. The device according to claim 2, wherein a hydrogen concentration of the third insulating layer is lower than the second hydrogen concentration.

8. The device according to claim 2, wherein
the first insulating layer includes silicon nitride,
the second insulating layer includes silicon oxide, and
the gate insulation layer includes silicon oxide.

9. The device according to claim 2, wherein the third insulating layer includes silicon oxide.

10. The device according to claim 2, wherein
the gate electrode is disposed between the semiconductor layer and the substrate unit,
the gate electrode has a side surface intersecting a plane perpendicular to the stacking direction, and
the gate insulation layer covers the side surface.

11. The device according to claim 2, wherein
the semiconductor layer is disposed between the gate electrode and the substrate unit,
the semiconductor layer has a side surface intersecting a plane perpendicular to the stacking direction, and
the third insulating layer covers the side surface.

12. The device according to claim 2, wherein a thickness of the first insulating layer is not less than 10 nanometers and not more than 1000 nanometers.

13. The device according to claim 2, wherein a thickness of the first insulating layer is not less than 10 nanometers and not more than 500 nanometers.

14. The device according to claim 2, wherein the semiconductor layer includes an amorphous portion.

15. The device according to claim 2, wherein
an outer edge of the semiconductor layer is on an inner side of an outer edge of the gate electrode when projected onto a plane perpendicular to the stacking direction.

16. The device according to claim 2, wherein
the first hydrogen concentration is not less than $1 \times 10^2/cm^3$ and not more than $5 \times 10^{22}/cm^3$,
the second hydrogen concentration is not less than $2 \times 10^2/cm^3$ and not more than $5 \times 10^{22}/cm^3$, and higher than the first hydrogen concentration.

17. The device according to claim 2, wherein a density of the second insulating layer is lower than a density of the third insulating layer.

18. The device according to claim 2, wherein a refractive index of the second insulating layer is lower than a refractive index of the third insulating layer.

* * * * *